United States Patent
Kim et al.

(10) Patent No.: US 7,821,836 B2
(45) Date of Patent: Oct. 26, 2010

(54) FLASH MEMORY DEVICE AND METHOD IN WHICH TRIM INFORMATION IS STORED IN MEMORY CELL ARRAY

(75) Inventors: Moo-Sung Kim, Yongin-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 203 days.

(21) Appl. No.: 12/166,364

(22) Filed: Jul. 2, 2008

(65) Prior Publication Data

US 2009/0010066 A1 Jan. 8, 2009

(30) Foreign Application Priority Data

Jul. 2, 2007 (KR) .................... 10-2007-0066142

(51) Int. Cl.
*G11C 16/06* (2006.01)
*G11C 16/04* (2006.01)

(52) U.S. Cl. .............................. 365/185.18; 365/185.01

(58) Field of Classification Search ....................... None
See application file for complete search history.

(56) References Cited

U.S. PATENT DOCUMENTS 7,130,227 B2   10/2006  Nobunaga et al.
2007/0253254 A1 * 11/2007 Morooka et al. ....... 365/185.18

FOREIGN PATENT DOCUMENTS

KR  1020030023341 A  3/2003
KR  1020050041608 A  5/2005
KR  1020050056376 A  6/2005
KR  1020060099139 A  9/2006

* cited by examiner

*Primary Examiner*—Hoai V Ho
*Assistant Examiner*—James G Norman
(74) *Attorney, Agent, or Firm*—Volentine & Whitt, PLLC

(57) ABSTRACT

A flash memory device which includes a memory cell array which stores data and trim information, and control logic which controls programming, erasing, and reading modes of the memory cell array. The control logic is operative to receive the trim information from the memory cell array in a power-up mode, and to optimize operational time periods of the programming, erasing, and reading modes in accordance with the trim information.

18 Claims, 3 Drawing Sheets

FLASH MEMORY DEVICE AND METHOD IN WHICH TRIM INFORMATION IS STORED IN MEMORY CELL ARRAY

PRIORITY CLAIM

A claim of priority under 35 U.S.C. §119 is made to Korean Patent Application No. 10-2007-66142, filed Jul. 2, 2007, the entire contents of which are incorporated herein by reference.

SUMMARY

The present invention generally relates to semiconductor memory devices, and more particularly, the present invention relates to flash memory devices, which are a type of electrically erasable and programmable read-only memories (EEPROMs).

Typically, a flash memory device is operable in three distinct modes, namely, a programming mode, an erasing mode, and a reading mode.

According to an aspect of the present invention, a flash memory device which includes a memory cell array which stores data and trim information, and control logic which controls programming, erasing, and reading modes of the memory cell array. The control logic is operative to receive the trim information from the memory cell array in a power-up mode, and to optimize operational time periods of the programming, erasing, and reading modes in accordance with the trim information.

According to another aspect of the present invention, an operational method is provided for a flash memory device having a memory cell array to store data. The method includes reading trim information from the memory cell array in a power-up mode, and controlling operational time periods of programming, erasing, and reading modes of the flash memory device in accordance with the trim information read from the memory cell away.

According to yet another aspect of the present invention, a memory system is provided which include a flash memory device, and a memory controller configured to control the flash memory device. The flash memory device includes a memory cell array which stores data and trim information, and control logic which controls programming, erasing, and reading modes of the memory cell array. The control logic is operative to receive the trim information from the memory cell array in a power-up mode, and to optimize operational time periods of the programming, erasing, and reading modes in accordance with the trim information.

According to still another aspect of the present invention, a computing system is provided which includes a microprocessor, a flash memory device, and a memory controller configured to control the flash memory device in response to the microprocessor. The flash memory device includes a memory cell array which stores data and trim information, and control logic which controls programming, erasing, and reading modes of the memory cell array. The control logic is operative to receive the trim information from the memory cell array in a power-up mode, and to optimize operational time periods of the programming, erasing, and reading modes in accordance with the trim information.

BRIEF DESCRIPTION OF THE DRAWINGS

Non-limiting and non-exhaustive embodiments of the present invention will be described with reference to the accompanying drawings, in which.

DETAILED DESCRIPTION OF EMBODIMENTS

Preferred embodiments of the present invention will be described below, illustrating examples of structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
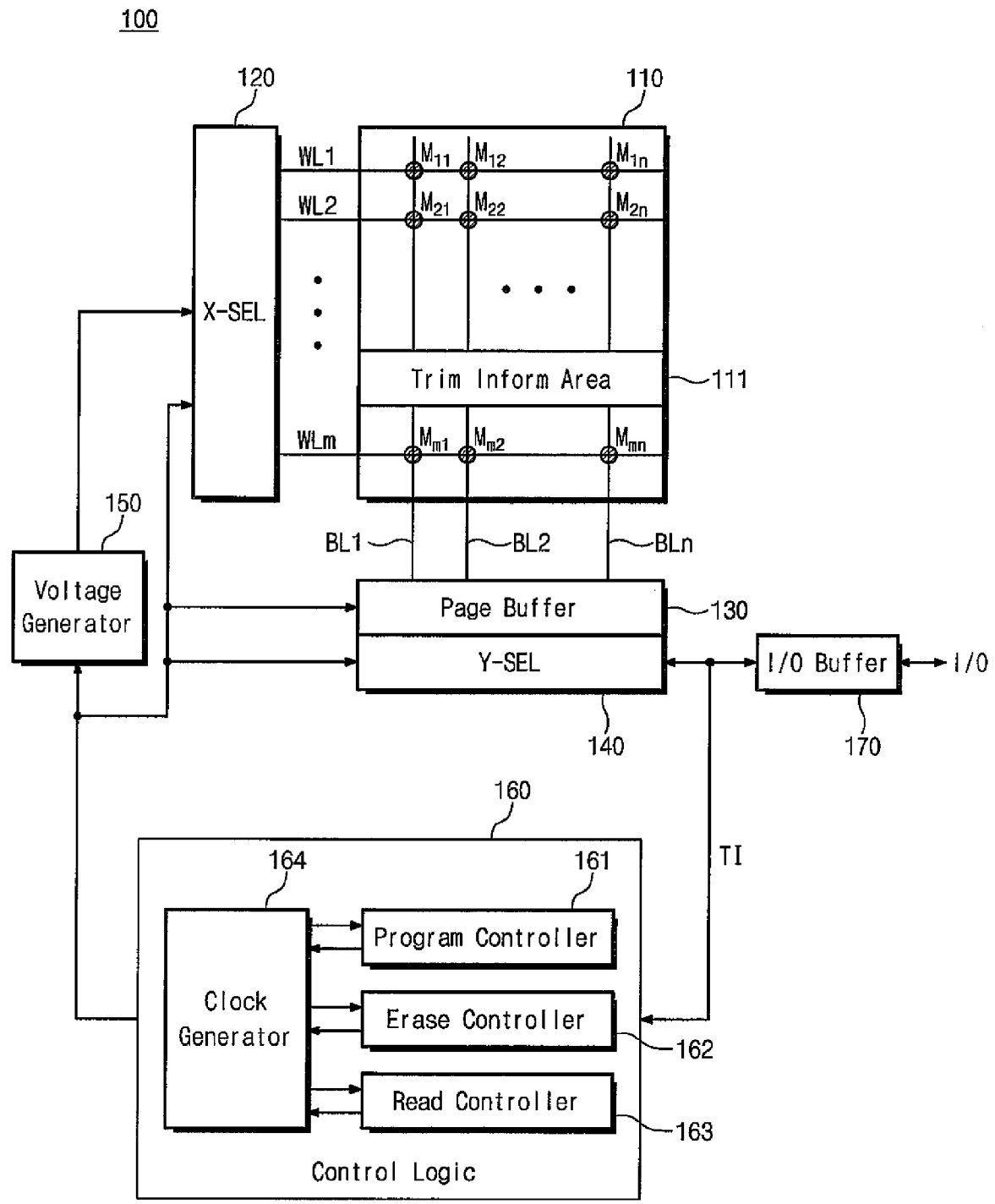
FIG. 1 is a block diagram of a flash memory device according to an embodiment of the present invention.

FIG. 1 is a block diagram of a flash memory device according to an embodiment of the present invention.

Referring to FIG. 1, the flash memory device 100 of this example includes a memory cell array 110, a row selection circuit 120, a page buffer circuit 130, a column selection circuit 140, a voltage generator 150, a control logic block 160, and an input/output buffer circuit 170.

The memory cell array 110 includes a plurality of memory cells which are generally located at the respective intersections of word lines WL1~WLm and bit lines BL1~BLn. (Herein below, the word line direction is deemed a "row" direction, and the bit line direction is deemed a "column" direction). Each memory cell may be structurally configured much like a metal-oxide-semiconductor field effect transistor (MOSFET), except that two gates are provide for each cell. For example, the memory cell of the flash memory device 100 may be formed of a P-type semiconductor substrate, N-type source and drain regions, a channel region between the source and drain regions, a floating gate for storing charges, and a control gate located over the floating gate.

The memory cell array 110 includes a trim information area 111. As will be explained in more detail later, the trim information area 111 stores trim information TI (or E-fuse data). The trim information contains information for regulating operational time periods for programming, erasing, and reading modes.

The row selection circuit 120 (X-SEL) selects a row of the memory cell array 110 in response to a row address provided from an external system (e.g., a memory controller), and supplies the corresponding word line WL with a word line voltage selected from among different voltages generated by the voltage generator 150.

The page buffer circuit 130 temporarily holds external data provided through the column selection circuit 140 (Y-SEL), during the programming mode, and sets the bit lines of the memory cell array 110 to specific voltages (e.g., a power source voltage Vcc or a ground voltage GND) in accordance with the data thereof. The external data is provided to the column selection circuit 140 by way of the input/output buffer circuit 170.

Further, the page buffer circuit 130 senses data from the memory cells selected through the bit lines in the reading mode. (The reading mode also includes a read verifying mode which is executed to confirm programming operations.) In the reading mode, data sensed by the page buffer circuit 130 is transferred to the input/output buffer circuit 170 by way of the column selection circuit 140, and the input/output buffer circuit 170 outputs the sense data to an external device.

The voltage generator 150 operates under control of the control logic block 160, and generates the different voltages needed for the programming, erasing, and reading modes.

The control logic block 160 controls an overall operation relevant to the programming, erasing, and reading modes in the flash memory device 100.

The control logic block 160 includes a programming controller 161, an erasing controller 162, a reading controller 163, and a clock generator 164. The programming, erasing, and reading controllers 161~163 control the clock generator 164 in accordance with trim information TI, which is stored in the trim information area 111 of the memory cell array 110, by adjusting operational periods of the programming, erasing, and reading modes, respectively. In particular, for example, the clock generator 164 is responsive to the programming, erasing, and reading controllers 161~163 to adjust the cycles of clock signals utilized for the programming, erasing, and reading modes, respectively.

The programming controller 161 receives the clock signal from the clock generator 164 and manages the programming mode by adjusting the clock signal generated by the clock generator 164 according to the trim information T1. In a similar manner, the erasing controller 162 and reading controller 163 manage the erasing mode and reading mode, respectively.

The control logic block 160 receives the trim information TI, which is sensed by the page buffer circuit 130 and stored in the trim information area 111 of the memory cell array 110, through the column selection circuit 140. The control logic block 160 controls the operational times of the programming, erasing, and reading modes in accordance with the trim information.

As an example, the control logic block 160 controls the operational times of the bit-line setup, program-execution, and recovery periods in the programming mode (refer to FIG. 2, discussed below) with reference to the trim information T1. In this case, the trim information T1 may include optimum times for each of the bit-line setup, program-execution, and recovery periods.

Figure 2:
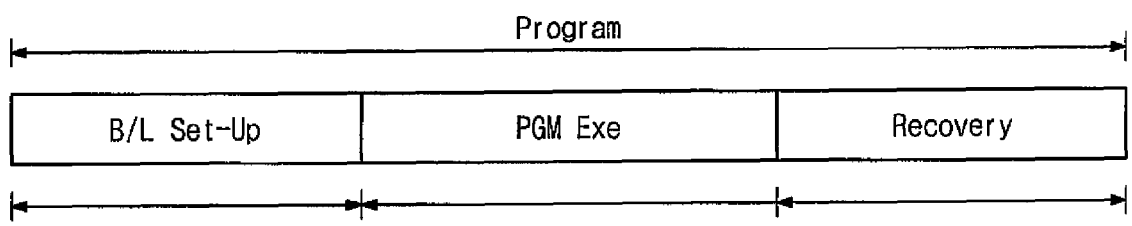
FIG. 2 illustrates operational periods of a programming mode of the flash memory device shown in FIG. 1 according to an embodiment of the present invention.

FIG. 2 illustrates the operational periods of the programming mode of the flash memory device shown in FIG. 1. As shown in FIG. 2, each programming mode operation is sequentially carried out by execution of a bit-line setup period, a program-execution period, and a recovery period.

During the bit-line setup period, the program controller 130 enables the page buffer circuit 130 and the column selection circuit 140 to load program data into the page buffer circuit 130. During the program-execution period, the data loaded into the page buffer circuit 130 are programmed into the flash memory cells coupled to a selected word line WL. Programming the flash memory cell may be carried out by applying a high voltage (e.g., program voltage 18V) to a memory cell control gate and by applying 0V to a memory cell source and drain, and to a semiconductor substrate. Under this bias condition, negative charges are accumulated in the floating gate by way of Fowler-Nordheim (F-N) tunneling. This mechanism forces the effective threshold voltage (Vth) of the flash memory cell transistor to be conditioned in a positive potential. Thereby, in the example of a 2-bit memory cell, the cell transistor is sensed as a non-conductive state, i.e., 'off' state, when a predetermined read voltage (Vread) is applied to the control gate (i.e., Vth>Vread). In the condition of being programmed, the memory cell is regarded as storing logical data '0' (or '1').

During the recovery period of the programming mode, the voltage that has been applied to the memory cells in the program-execution period is initialized for the next operation.

Figure 3:
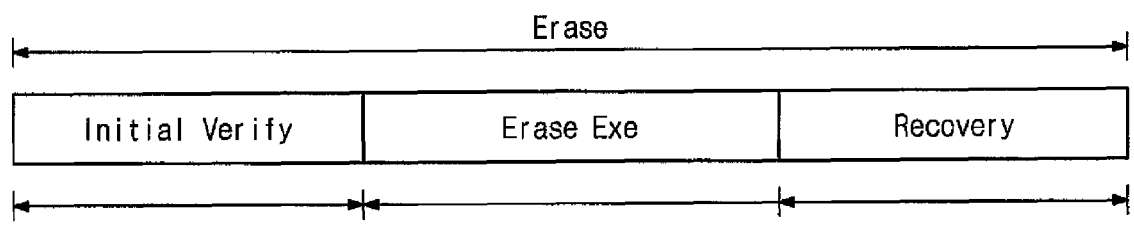
FIG. 3 illustrates operational periods of an erasing mode of the flash memory device shown in FIG. 1 according to an embodiment of the present invention.

FIG. 3 illustrates operation periods of the erasing mode of the flash memory device shown in FIG. 1. Referring to FIG. 3, the erasing mode is carried out by successive initial-verifying, erase-execution, and recovery periods.

In the initial-verifying period, erased states of the memory cells. In detail are detected, i.e., data are sensed from the memory cells through the page buffer circuit 130 by a verifying operation. The data read by the page buffer circuit 130 are provided to the erasing controller 162 by way of the column selection circuit 140. The erasing controller 162 verifies the sensed data. If there is a data value that is unerased, i.e., if there is an unerased memory cell, the erasing controller 162 conducts the erasing operation. If the sensed data are detected as all corresponding to erased states, i.e., if the memory cells are all conditioned in the erased stated, the erasing controller 162 disables the erasing operation disabled.

In the erase-execution period, the erasing controller 162 executes the erasing operation. Erasing of the flash memory cell is carried out by applying 0V to the control gate and be applying a high voltage (e.g., 20V) to the semiconductor substrate. Under this bias condition, negative charges are discharged toward the semiconductor substrate from the floating gate through the tunneling oxide film by F-N tunneling. This mechanism forces the effective threshold voltage (Vth) of the flash memory cell transistor to be conditioned in a negative potential. Thereby, the cell transistor is sensed as a conductive state, i.e., 'on' state, when a predetermined read voltage (Vread) is applied to the control gate (i.e., Vth<Vread). In the condition of being programmed, the memory cell is regarded as storing logical data '1' (or '0').

During the recovery period of the erasing mode, the voltage that has been applied to the memory cells in the erase-execution period is initialized for the next operation.

Details of programming and erasing modes of a flash memory device are disclosed, for example, in U.S. Pat. No. 5,841,721 entitled "MULTI-BLOCK ERASE AND VERIFICATION IN A NONVOLATILE SEMICONDUCTOR MEMORY DEVICE AND A METHOD THEREOF", which is incorporated herein by reference.

Figure 4:
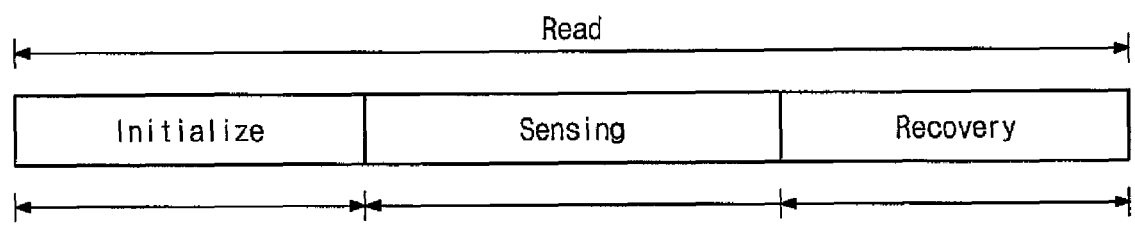
FIG. 4 illustrates operation periods of a reading mode of the flash memory device shown in FIG. 1 according to an embodiment of the present invention.

FIG. 4 illustrates operational periods of the reading mode of the flash memory device shown in FIG. 1. Referring to FIG. 4, the reading mode is carried out by sequential execution of initializing, sensing, and recovery periods.

During the initializing period of the reading mode, the reading controller 163 enables the page buffer circuit 130 to precharge selected bit lines. By precharging the bit lines, the bit lines are charged up to a specific voltage level.

During the sensing period, a read voltage (Vread; e.g., 4.5V) is applied to deselected word lines while 0V is applied to a selected word line. This is called 'reading operation'. The reading operation is carried out through the page buffer circuit. One non-limiting example of a page buffer circuit may be found in U.S. Pat. No. 5,761,132, entitled "INTEGRATED CIRCUIT MEMORY DEVICES WITH LATCH-FREE BUFFERS THEREIN FOR PREVENTING READ FAILURES", which is incorporated herein by reference. In the reading operation, if the memory cell coupled to the selected word line is sensed as an erased cell (i.e., on-cell), the corresponding bit line goes down to a low level (i.e., the ground level) in voltage. On the other hand, if the memory cell coupled to the selected word line is sensed as a programmed cell (i.e., off-cell), the corresponding bit line is maintained on its precharged voltage level. Such a process of changing the bit line level by a programmed state of the selected memory cell is referred to as 'bit-line development'. From a result of the bit-line development, if the bit line is maintained on its precharged level, the corresponding memory cell is identified as an off-cell. If a voltage of the bit line falls down to a low level, the corresponding memory cell is identified as an on-cell. A sensed voltage level of the bit line is latched in the page buffer circuit 130 as a read result.

During the recovery period of the reading mode, the voltage that has been applied to the memory cells in the reading operation is initialized for the next operation.

The operational times of each period of the programming, erasing and reading modes can be optimized in a test process.

For example, the operating time of the program-execution period may be initially set to 9 ns, but in a later test/evaluation process of the flash memory device, it may be determined that an optimum operation time is 6 ns. Information indicative of the optimum operation time of the program-execution time is stored in the trim information area 111 as the trim information TI. Likewise, optimum operation times for the bit-line setup period and/or recovery period of the programming mode may be determined and stored as trim information T1. The same applies for one or more periods of the erasing mode and one or more periods of the reading mode.

At the time of power-up, the trim information TI of the trim information area 111 is detected by the page buffer circuit 130. The trim information TI detected by the page buffer circuit 130 is provided to the program controller 161 of the control logic block 160 by way of the column selection circuit 140. The program controller 161 of the control logic block 160 stores the trim information TI in an internal storage area (e.g., latch).

In the programming mode, the programming controller 161 operates to control the clock generator 164 to adjust the operation times of the bit-line setup, program-execution, and/or recovery periods in correspondence with the trim information TI. In other words, the programming controller 161 manages the clock generator (e.g., oscillator) 164 to adjust clock cycles according to the periods of the programming mode indicated by the trim information TI. In the previous example, the operation time of the program-execution period is initially set at 9 ns, but the optimum operation time of the program-execution period is 6 ns. The programming controller controls the clock generator 164 to adjust the clock cycle for optimizing the operation time of the program-execution period to 6 ns in accordance with the trim information TI of the program-execution period. The operation times of the bit-line setup and recovery periods of the programming mode can be adjusted with reference to their corresponding trim information TI in the same manner.

The clock generator 164 operates to generate a clock signal whose cycle is adjusted for the bit-line setup, program-execution, and/or recovery periods of the programming mode by the programming controller 161.

The programming controller 161 receives the clock signal, whose cycle is adjusted for the bit-line setup, program-execution, and/or recovery periods of the programming mode, from the clock generator 164 and controls the programming mode in sync with the clock signal.

The operations of the erasing controller 162 and reading controller 163 are analogous to that of the programming controller 161. Namely, during the power-up, the trim information TI corresponding to the optimum operational times of the initial-verifying, erase-execution, and recovery periods of the erasing mode is stored in the erasing controller 162. Also, during power-up, the trim information TI corresponding to the optimum operational times of the initializing, sensing, and recovery periods of the erasing mode is stored in the reading controller 163.

The erasing controller 162 controls the clock generator 164 to set the operational times of the initial-verifying, erase-execution, and/or recovery periods of the erasing mode to optimum values in accordance with corresponding trim information TI stored therein. Likewise, the reading controller 163 controls the clock generator 164 to set the operational times of the initializing, sensing, and/or recovery periods of the reading mode to optimum values in accordance with corresponding trim information TI stored therein.

As a result, the flash memory device 100 according to embodiments of the present invention allow for improved time performance since the operational times of the programming, erasing, and reading modes may be set in accordance with corresponding trim information TI contained in the memory cell array.

Figure 5:
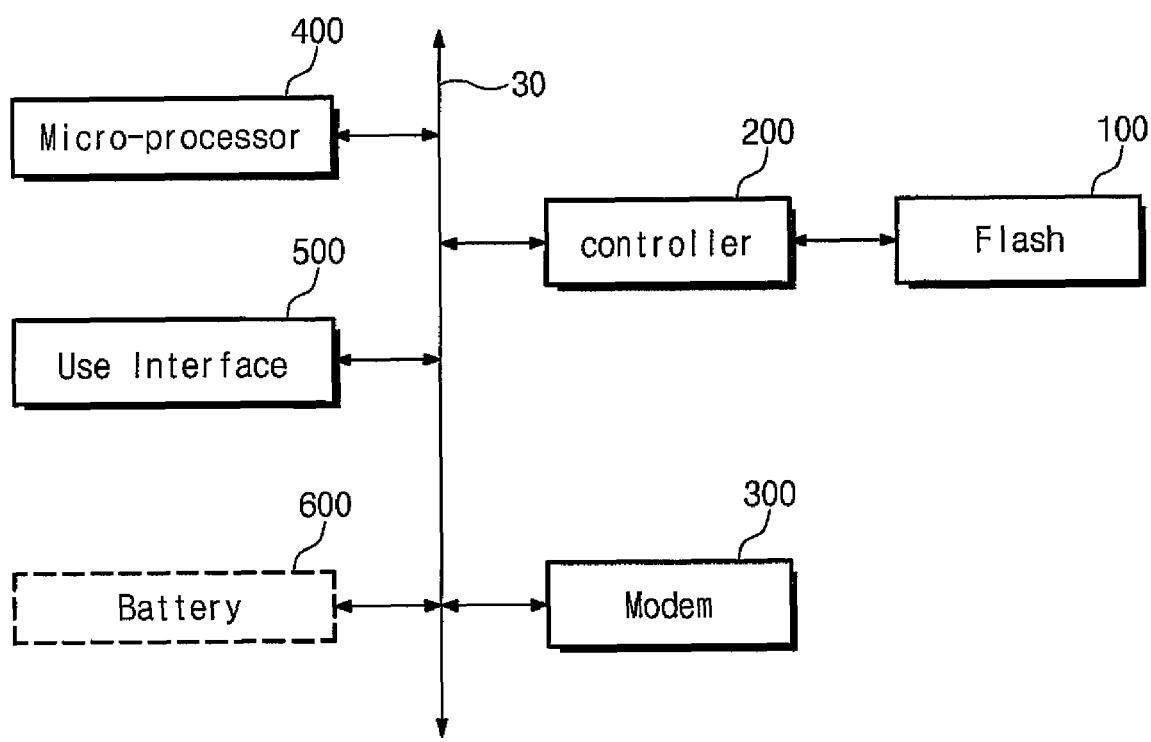
FIG. 5 is a block diagram of a computing system which includes a flash memory device according to an embodiment of the present invention.

Flash memory devices are nonvolatile memories capable of maintaining data stored therein in the absence of supplied power. As such, flash memory devices may be utilized in a wide variety of computer system application including, for example, mobile apparatuses such as cellular phones, personal digital assistants (PDA), digital cameras, portable gaming consoles, MP3 players, high-definition TVs, digital versatile disks (DVDs), routers, and global positioning systems (GPSs). The flash memory devices may be employed as code storage, as well as data storage. FIG. 5 is a block diagram showing a schematic computing system including the flash memory device of the present invention. The computing system includes a microprocessor 400, a user interface 500, a modem 300 such as a baseband chipset, a flash memory controller 200, and a flash memory device 100, all of which are connected to a bus 300. The flash memory controller 200 and the flash memory device constitute a flash memory system. The flash memory device 100 may be configured in accordance with one or more embodiments previously described herein. In the flash memory device shown 100 in FIG. 1, for example, N-bit data (N is a positive integer) to be processed by the microprocessor 400 are stored and read through the memory controller 200. If, for example, the computing system shown in FIG. 5 is a mobile apparatus, it is further equipped with a battery 600 for supplying power thereto. Although not shown in FIG. 5, the computing system may be further equipped with an application chipset, a camera image processor (e.g., CMOS image sensor; CIS), a mobile DRAM, and so on.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a memory cell array which stores data and trim information; and
   control logic which controls programming, erasing, and reading modes of the memory cell array,
   wherein the control logic is operative to receive the trim information from the memory cell array in a power-up mode, and to optimize operational time periods of the programming, erasing, and reading modes in accordance with the respective trim information for the programming, erasing, and reading modes, wherein the control logic generates respective clock signals for the programming, erasing, and reading modes and adjusts the generated respective clock signals according to the respective trim information.

2. The flash memory device as set forth in claim 1, wherein the memory cell array comprises a trim information area in which the trim information is stored.

3. The flash memory device as set forth in claim 1, wherein the trim information is indicative of the operational time periods of the programming, erasing, and reading modes.

4. The flash memory device as set forth in claim 1, wherein the trim information includes programming mode trim information indicative of an operational time period of the programming mode, erasing mode trim information indicative of an operational time period of the erasing mode, and reading mode trim information indicative of an operational time period of the reading mode, and wherein the control logic comprises:
 a clock generator which generates respective clock signals for the programming, erasing, and reading modes;
 a program controller which receives the programming mode trim information from the memory cell array in the power-up mode;
 an erasing controller which receives the erasing mode trim information from the memory cell array in the power-up mode; and
 a reading controller which receives the reading mode trim information from the memory cell array in the power-up mode,
 wherein the programming, erasing, and reading controllers control the clock generator to adjust the respective clock signals for the programming, erasing, and reading modes according to the programming mode trim information, erasing mode trim information, and reading mode trim information, respectively.

5. The flash memory device as set forth in claim 4, wherein the clock generator is responsive to the programming, erasing, and reading controllers to adjust a cycle of the respective clock signals.

6. The flash memory device as set forth in claim 4, wherein the programming mode includes a bit-line setup period, a program-execution period, and a recovery period.

7. The flash memory device as set forth in claim 6, wherein the programming mode trim information includes information for optimizing at least one of the bit-line setup period, the program-execution period, and the recovery period.

8. The flash memory device as set forth in claim 7, wherein the programming controller controls the clock generator to optimize operational times of the at least one of the bit-line setup period, the program-execution period, and the recovery period.

9. The flash memory device as set forth in claim 4, wherein the erasing mode includes an initial-verifying period, an erase-execution period, and a recovery period.

10. The flash memory device as set forth in claim 9, wherein the erasing mode trim information includes information for optimizing at least one of the initial-verifying period, the erase-execution period, and the recovery period.

11. The flash memory device as set forth in claim 10, wherein the erasing controller controls the clock generator to optimize operational times of the at least one of the initial-verifying period, the erase-execution period, and the recovery period.

12. The flash memory device as set forth in claim 4, wherein the reading mode includes an initializing period, a sensing period, and a recovery period.

13. The flash memory device as set forth in claim 12, wherein the reading mode trim information includes information for optimizing at least one of the initializing period, the sensing period, and the recovery period.

14. The flash memory device as set forth in claim 13, wherein the reading controller controls the clock generator to optimize operational times of the at least one of the initializing period, the sensing period, and the recovery period.

15. An operational method for a flash memory device having a memory cell array to store data, the method comprising:
 reading respective trim information from the memory cell array in a power-up mode, the respective trim information for programming, erasing, and reading modes of the flash memory device; and
 generating respective clock signals for the programming, erasing, and reading modes, and adjusting the generated respective clock signals according to the respective trim information read from the memory cell array.

16. The method as set forth in claim 15, wherein the operational times are controlled by adjusting a cycle of respective clock signals of the programming, erasing, and reading modes in accordance with the trim information.

17. A memory system comprising a flash memory device, and a memory controller configured to control the flash memory device, wherein the flash memory device comprises:
 a memory cell array which stores data and respective trim information for programming, erasing, and reading modes of the flash memory device; and
 control logic which controls the programming, erasing, and reading modes of the memory cell array,
 wherein the control logic is operative to receive the respective trim information from the memory cell array in a power-up mode, to generate respective clock signals for the programming, erasing, and reading modes, and to adjust the generated respective clock signals according to the respective trim information.

18. A computing system comprising a microprocessor, a flash memory device, and a memory controller configured to control the flash memory device in response to the microprocessor, wherein the flash memory device comprises:
 a memory cell array which stores data and respective trim information for programming, erasing, and reading modes of the flash memory device; and
 control logic which controls the programming, erasing, and reading modes of the memory cell array,
 wherein the control logic is operative to receive the respective trim information from the memory cell array in a power-up mode, to generate respective clock signals for the programming, erasing, and reading modes, and to adjust the generated respective clock signals according to the respective trim information.

* * * * *